(12) United States Patent
Uchida

(10) Patent No.: US 6,560,250 B1
(45) Date of Patent: May 6, 2003

(54) LASER DIODE DRIVE SIGNAL PROCESSOR AND METHOD FOR DRIVING LASER DIODE

(75) Inventor: Shigenobu Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/618,245

(22) Filed: Jul. 18, 2000

(30) Foreign Application Priority Data

Jul. 23, 1999 (JP) .......................................... 11-208390

(51) Int. Cl.$^7$ ................................................ H01S 3/10
(52) U.S. Cl. ................................ 372/29.012; 372/38.02
(58) Field of Search .......................... 372/29.012, 38.02

(56) References Cited

U.S. PATENT DOCUMENTS

| | | | | |
|---|---|---|---|---|
| 4,539,686 A | * | 9/1985 | Bosch et al. ................... | 372/26 |
| 4,698,817 A | * | 10/1987 | Burley | |
| 5,315,606 A | * | 5/1994 | Tanaka ......................... | 372/38 |
| 5,936,986 A | * | 8/1999 | Cantatore et al. .............. | 372/38 |

* cited by examiner

Primary Examiner—James Davie
(74) Attorney, Agent, or Firm—Oblon, Spivak, McClelland, Maier & Neustadt, P.C.

(57) ABSTRACT

There is provided a laser diode drive signal processor for driving a laser diode to be used to emit a laser beam for accessing an optical information recording medium with the laser beam. The processor has an alternating current side driving current supply circuit for supplying a first driving current according to a signal level of an alternating current component; a photo diode coupled to the laser diode for detecting a light amount of the laser beam; error signal generating circuit for generating an error signal based on the detected light amount of the laser beam and a reference signal; direct current side driving current supply circuit for supplying a second driving current according to a signal level of the error signal; and adding circuit for adding the first driving current from the alternating current side driving current supply circuit and the second driving current from the direct current side driving current supply circuit to generate a third driving current. Thus generated the third driving current composed of the first and second driving currents is supplied to the laser diode.

7 Claims, 2 Drawing Sheets

LASER DIODE DRIVE SIGNAL PROCESSOR AND METHOD FOR DRIVING LASER DIODE

BACKGROUND OF THE INVENTION

1. Field of the Invention

The present invention relates to a laser diode drive signal processor and a method for driving a laser diode, which are applicable to, for example, an optical disk apparatus for accessing a phase change type optical disk. The present invention further relates to the realization of driving a laser diode with decreased consumption power by supplying a first driving current according to a signal level of an alternating current component of a driving signal for driving the laser diode, and by supplying a second driving current according to a signal level of an error signal compared to the driving signal by detecting the light amount of a laser beam, and further by adding those first and second driving currents to drive the laser diode.

2. Description of the Related Art

In a conventional optical disk apparatus for accessing a phase change type optical disk, a laser diode emits a laser beam and focuses the beam on the optical disk. A returning beam reflected on the a phase change type optical disk is received and a receiving result of the returning beam is processed to reproduce data recorded on the optical disk.

On the other hand, when the conventional optical disk apparatus records data on the optical disk, the apparatus switches a laser beam emitting period between a first period for intermittently raising the light amount of the laser beam and irradiating the optical disk and a second period for irradiating the optical disk with a fixed light amount of the laser beam in accordance with the data to be recorded, and thereby the conventional optical disk apparatus forms sequential marks and spaces on an information recording surface of the optical disk to record desired data on the optical disk in this way.

Incidentally, this kind of optical disk apparatus can increase the recording density by shortening the wavelength of the laser beam. For achieving this, accessing the optical disk with a laser beam having a wavelength of, for example, 500 nm, on the contrary of the wavelength from 650 nm to 780 nm of the laser beam used by the conventional optical disk apparatus at the time of accessing the optical disk, would make it possible to increase the recording density by the difference of the wavelength.

However, a laser diode for emitting such a short wavelength laser beam generally has a large resistance value, and it is thus required to raise a driving voltage necessary for driving such a short wavelength type laser diode by the difference in the resistance value, compared with the conventional long wavelength type laser diode. As a result, an optical disk apparatus equipped with such short wavelength type laser diode has to raise the voltage of its power supply.

Hence, such conventional optical disk apparatus has a problem that its driving circuit increases its consumption power. Further high power and high speed driving device id very expensive.

SUMMARY OF THE INVENTION

The present invention is made from the consideration to such a problem, and aims to propose a laser diode drive signal processor and a method for driving a laser diode that are capable of driving the laser diode with lowered consumption power.

According to a first aspect of the present invention, there is provided a laser diode drive signal processor for driving a laser diode to be used to emit a laser beam for accessing an optical information recording medium with the laser beam. The processor comprises alternating current side driving current supply means for supplying a first driving current according to a signal level of an alternating current component; light amount detecting means coupled to the laser diode for detecting a light amount of the laser beam; error signal generating means for generating an error signal based on the detected light amount of the laser beam and a reference signal; direct current side driving current supply means for supplying a second driving current according to a signal level of the error signal; adding means for adding the first driving current from the alternating current side driving current supply means and the second driving current from the direct current side driving current supply means to generate a third driving current; and supply means for supplying the third driving current composed of the first and second driving currents to the laser diode.

The laser diode drive signal processor according to the first aspect of the present invention can decrease its consumption power because the first driving current according to the signal level of the alternating current component does not include a direct current component and thereby the first driving current can be obtained from a lower power-supply voltage.

According to a second aspect of the invention, there is provided a method for driving a laser diode to be used to emit a laser beam for accessing an optical information recording medium with the laser beam. The method comprises the steps of supplying a first driving current according to a signal level of an alternating current component; detecting a light amount of the laser beam; generating an error signal based on the detected light amount of the laser beam and a reference signal; supplying a second driving current according to a signal level of the error signal; adding the first driving current and the second driving current to generate a third driving current; and supplying the third driving current composed of the first and second driving currents to the laser diode.

The method for driving a laser diode according to the second aspect of the present invention can similarly decrease the consumption power of an optical disk apparatus to which the method is applied, because the first driving current according to the signal level of the alternating current component does not include a direct current component and thereby the first driving current can be supplied from a lower power-supply voltage.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIGS. 2A1, 2A2, 2B, 2C and 2D are drawings of signal waveforms for illustrating of the operation of the structure shown in FIG. 1.

DESCRIPTION OF THE PREFERRED EMBODIMENTS

Drawings are suitably referred to while an embodiment of the present invention is described in detail.

(1) Structure of an Embodiment

Figure 1:
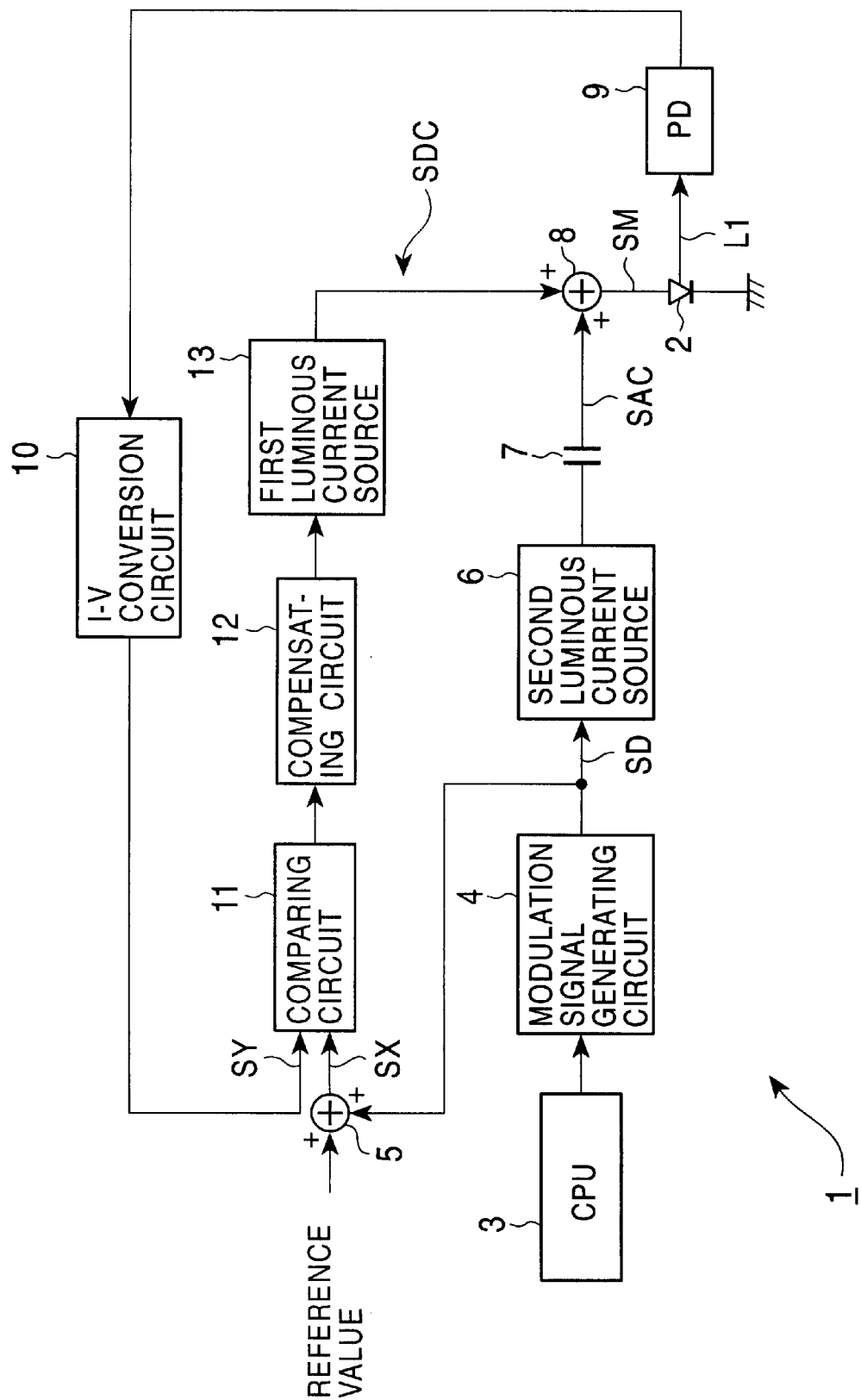
FIG. 1 is a block diagram showing a principal part of an optical disk apparatus according to an embodiment of the present invention.

FIG. 1 is a block diagram showing a principal part of an optical disk apparatus according to an embodiment of the present invention. The optical disk apparatus 1 drives a laser diode 2 made from gallium nitride under the control of a central processing unit (CPU) 3 to irradiate a laser beam L1 emitted from the laser diode 2 on a phase change type optical disk, not shown, and thereby the optical disk apparatus 1 accesses the optical disk.

That is, the central processing unit 3 is a controller for controlling the whole operation of the optical disk apparatus 1. The central processing unit 3 controls the operation of a modulation signal generating circuit 4 according to data to be recorded at the time of recording, and the central processing unit 3 stops the operation of the modulation signal generating circuit 4 at the time of reproducing. In addition, the central processing unit 3 outputs a reference value for driving the laser diode 2 to an adding circuit 5 at the times of both recording and reproducing.

The modulation signal generating circuit 4 generates and outputs a modulation signal SD according to data for driving as shown in FIGS. 2(A1) and 2(A2) at the time of recording in conformity with the control of the central processing unit 3.

The modulation signal SD repeats a period TM for forming marks on the optical disk and a period TS for forming a space on the optical disk according to data to be recorded. The signal SD is kept at a 0 level for the period TS for forming the space. On the contrary, for the period TM for forming the marks, a prescribed signal waveform is repeated at every 80 nanosecond. During this 80 nanoseconds, the signal level of the signal SD rises from 0 level and is kept at a high level for first 10 seconds and, after that, the signal level repeats rises and falls for a period of 5 nanoseconds by a prescribed number of times.

Thereby, the modulation signal generating circuit 4 is designed to generate and output only an alternating current component of a driving signal to be used for driving the laser diode 2. The optical disk apparatus 1 is designed to set the level of the residual direct current component of the driving signal at the adding circuit 5 as the reference value with the central processing unit 3. Incidentally, in the present embodiment, the reference value is set to be an average light amount at the time of reproduction.

A second luminous current source 6 generates a first driving current, the current value of which varies according to the modulation signal SD, and the current source 6 outputs thus generated first driving current to the laser diode 2 through a coupling capacitor 7 and an adding circuit 8.

Thereby, since the second luminous current source 6 drives the laser diode 2 by bearing only the alternating current component of a third driving current for driving the laser diode 2 and does not bear a direct current component of the third driving current. Accordingly, the current source 6 can operate under a lower power-supply voltage to decrease its consumption power. The second luminous current source 6 constitutes a alternating current driving current supply means for supplying the first driving current of the alternating current.

Figure 2B:
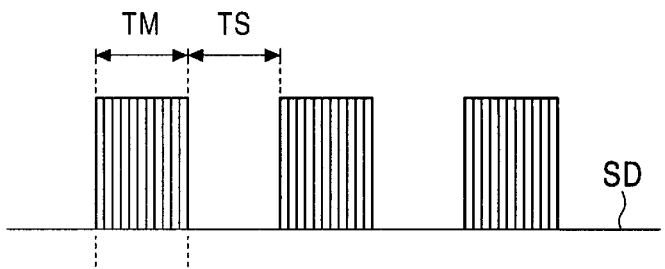
Figure 2B:
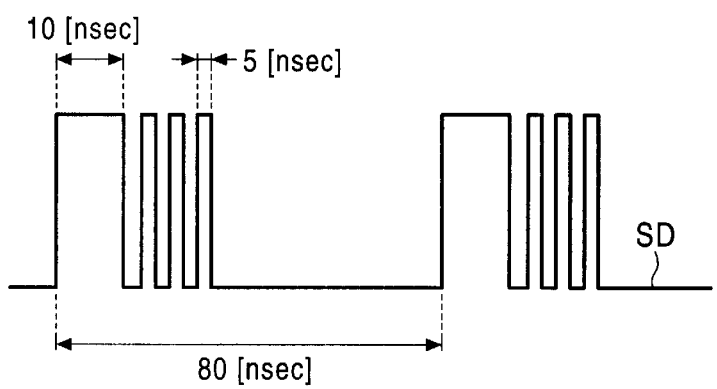
Figure 2B:
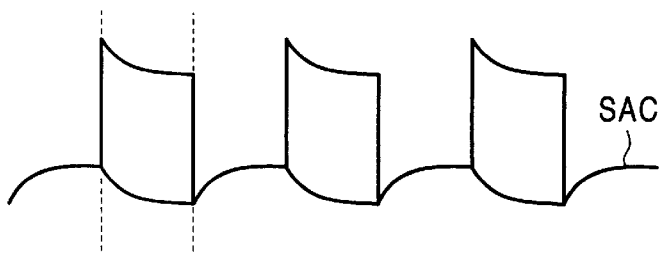

Now, the laser diode 2 generates heat by emitting the laser beam L1 and varies the amount of the laser beam LI due to the generated heat. In addition, in the case where the first driving current is supplied to the laser diode 2 through the coupling capacitor 7 as mentioned above, the first driving current SAC flowing through the laser diode 2 decreases its lower frequency components of its alternating current component in conformity with a time constant composed of the capacity of the coupling capacitor 7 and the output impedance of the second luminous current source 6 as shown in FIG. 2(B), and thereby the direct current level of the third driving current pulsates. Incidentally, the waveform shown in FIG. 2(B) shows a case where the pulsation of the first driving current SAC is not yet corrected by the feedback loop that will be described later.

By this reason, the optical disk apparatus 1 is designed to prevent the variation of the light amount and the pulsation of the direct current level by the feedback loop including a photodiode (PD) 9.

That is, the photodiode 9 receives the laser beam L1 emitted by the laser diode 2 in conformity with so-called front monitor method, and outputs a result of the reception of the laser beam L1.

A current-voltage conversion (I-V conversion) circuit 10 performs the current-voltage conversion processing to the reception result of the photodiode 9, and outputs a light amount detection result SY, the signal level of which varies according to the light amount of the laser beam L1. Hence, the photodiode 9 and the current-voltage conversion circuit 10 constitute a light amount detecting means for detecting the light amount of the laser beam emitted by the laser diode 2.

The adding circuit 5 adds the reference value set by the central processing unit 3 and the modulation signal SD, and thereby generates a driving signal SX that is the final drive current for the laser diode 2. Hence, the central processing unit 3, the modulation signal generating circuit 4 and the adding circuit 5 constitute a driving signal generating means for generating the driving signal.

A comparing circuit 11 generates an error signal compared to the final drive current by subtracting the light amount detection result SY from the driving signal SX obtained from the adding circuit 5. Hence, the comparing circuit 11 constitutes an error signal generating means for generating the error signal.

By generating the error signal as stated above, the error signal is added the direct current level of the final object of control and the lower frequency components necessary for correcting the aforesaid pulsation of the direct current level, where the lower frequency components is described with reference to FIG. 2(B).

A compensating circuit 12 performs integration processing of the error signal from the comparing circuit 11, and thereby decreases a steady-state deviation of the third driving current.

Figure 2C:
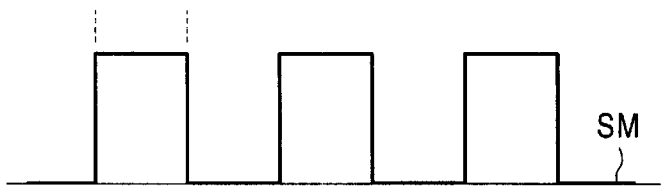
Figure 2D:
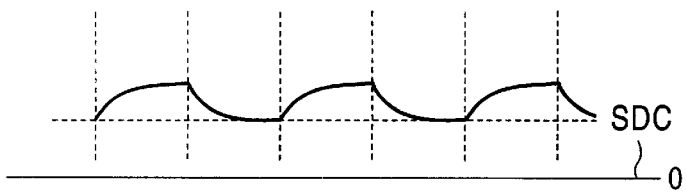

A first luminous current source 13 generates a second driving current SDC to drive the laser diode 2 by the second driving current through the adding circuit 8. The second driving current SDC is depicted in FIG. 2D. This second driving current SDC compensates direct current component of the first driving current SAC.

Hence, the photodiode 9, the current-voltage conversion circuit 10, the comparing circuit 11, the compensating circuit 12 and the first luminous current source 13 form a feedback loop and are designed to make it possible to drive the laser diode 2 at the direct current level determined in conformity with the reference value as well as to correct the variation of the direct current level due to the drive by the alternating current component in the second luminous current source 6. Hence, the first luminous current source 13 constitutes a direct current driving current supply means for supplying the second driving current of the direct current.

Thus, the adding circuit 8 adds the first driving current from the second luminous current source 6 and the second driving current from the first luminous current source 13 to generate a third driving current SM and to output the third driving current SM to the laser diode 2. Thereby, the laser diode 2 is designed to output the laser beam L1 by being driven with the third driving current following the driving signal SX as shown in FIG. 2(C).

In the optical disk apparatus 1, for separating the alternating current component and providing the alternating current component through another path to the laser diode 2 for driving it like this, the relationship among $Z0(\Omega)$, which is the impedance of the laser diode 2, $Z1(\Omega)$, which is the output impedance of the first luminous current source 13, and $Z2(\Omega)$, which is the impedance of the second luminous current source 6, is set to be $Z2 \leq Z0 < Z1$. Hence, the optical disk apparatus 1 is designed so that the impedance Z viewed from the second luminous current source 6 side is equal to or smaller than the half of the output impedance Z2 as indicated by the following formula. Hence, the optical disk apparatus 1 is designed to suppress the outflow of the first driving current from the second luminous current source 6 to the first luminous current source 13 side, and further to increase the drive speed of laser diode 2.

$$Z=(Z0 \times Z2)/(Z0+Z2)$$

Provided that the capacitance of the coupling capacitor 7 is indicated by the character C (F) and that the output impedance of the second luminous current source 6 is indicated by the character $Z(\Omega)$, the loop frequency band of the feedback loop is set to expand on the frequency side higher than the cut-off frequency f based on the coupling capacitor 7, which frequency f is indicated by the following formula. Thereby, the optical disk apparatus 1 is designed to correct surely the lower frequency components decreased by the coupling capacitor 7 as shown in FIG. 2(C) by means of the feedback control.

$$f=1/(2 \times \pi \times C \times Z)$$

Incidentally, in the present embodiment, the output impedance of the second luminous current source 6 and the forward direction impedance of the laser diode 2 are set to be the same value, and the capacitance of the coupling capacitor 7 is set to be 0.1 $\mu$F, and further the loop frequency band of the feedback loop is set to be 1 MHz.

(2) The Operation of the Embodiment

The optical disk apparatus 1 constructed as mentioned above drives the laser diode 2 made from gallium nitride in conformity with the control of the central processing unit 3, and then the laser beam L1 emitted by the laser diode 2 is made to irradiate the phase change type optical disk, not shown, for accessing the optical disk.

Now, since the laser diode 2 is made from the gallium nitride, the wavelength of the laser beam L1 irradiating the optical disk is short to decrease the spot diameter of the laser beam L1 in the optical disk apparatus 1, and thereby the recording density of the optical disk can be increased.

When the optical disk is accessed in this manner, the modulation signal generating circuit 4 is controlled by the central processing unit 3 according to the data to be recorded at the time of recording in the optical disk apparatus 1, and thereby the modulation signal SD shown in FIGS. 2(A1) and 2(A2) is obtained from the modulation signal generating circuit 4. Furthermore, the first driving current, the value of which varies according to the modulation signal SD, is generated by the second luminous current source 6 and supplied to the laser diode 2 through the coupling capacitor 7 and the adding circuit 8.

Hence, in the optical disk apparatus 1, the second luminous current source 6 bears and outputs only the alternating current component of the third driving current for driving the laser diode 2 and does not bear the direct current component of the third driving current, so that the current source 6 is driven by a lower power-supply voltage to decrease its consumption power.

Furthermore, in the optical disk apparatus 1, the laser beam L1 emitted by the laser diode 2 is received by the photodiode 9, and thereby the light amount of the laser beam L1 is detected. In addition, in the comparing circuit 11, the light amount detection result SY is subtracted from the driving signal SX for driving the laser diode 2 to generate the error signal for the final drive object. Furthermore, in the first luminous current source 13, the second driving current is generated according to the error signal to be supplied to the laser diode 2 through the adding circuit 8.

Hence, in the optical disk apparatus 1, the feedback loop is formed to output the residual direct current component of the third drive current and to correct the pulsation of the first driving current supplied from the second luminous current source 6.

Thus, in the optical disk apparatus 1, the second driving current from the first luminous current source 13 and the first driving current from the second luminous current source 6 are added by the adding circuit 8 and supplied to the laser diode 2 as the third driving current composed of the added first and second driving current. Therefore, the laser diode 2 can be driven by the third driving current following the driving signal SX.

In this case, in the control using the feedback loop, the error signal supplied from the comparing circuit 11 is processed to be integrated by the compensating circuit 12, and the steady-state deviation of the third driving current can thereby be decreased.

Furthermore, in the control using the feedback loop, the loop frequency band is set to be equal to or higher than the cut-off frequency based on the coupling capacitor 7, and thereby the lower frequency components decreased by the coupling capacitor 7 can surely be corrected by means of the feedback loop.

Furthermore, in the case where the alternating current component is separated and the laser diode 2 is driven through another path, the output impedance of the first luminous current source 13 is set to be larger than the forward direction impedance of the laser diode 2, and the output impedance of the second luminous current source 6 is set to be equal to or smaller than the forward direction impedance of the laser diode 2, and thereby the output impedance viewed from the output side of the second luminous current source 6 becomes equal to or smaller than the half of the output impedance of the second luminous current source 6. Thus, the outflow of the first driving current by the second luminous current source 6 to the first luminous current source 13 side can be suppressed, and further the drive speed of laser diode 2 can be increased.

(3) Advantages of the Embodiment

According to the aforementioned structure, the first driving current according to the signal level of the alternative component of the driving signal for driving the laser diode is outputted, and the second driving current according to the second signal level of the error signal compared to the driving signal is outputted by detecting the light amount of the laser beam. Furthermore, those first and second driving currents are added for driving the laser diode, and thereby the laser diode can be driven with the lowered consumption power.

In this case, the steady-state deviation of the third driving current composed of the added first and second driving currents can be decreased by performing the integration processing of the error signal generated in the feedback loop.

Furthermore, the loop band of the feedback loop is set to be equal to or higher than the cut-off frequency based on the coupling capacitor 7, and thereby the lower frequency side components decreased by the coupling capacitor 7 can surely be corrected by the feedback loop.

Furthermore, in case of separating the alternating current component and driving the laser diode 2 through another path in this manner, the output impedance of the first luminous current source 13 is set to be larger than the forward direction impedance of the laser diode 2, and the output impedance of the second luminous current source 6 is set to be equal to or smaller than the forward direction impedance of the laser diode 2. Thus, the outflow of the first driving current by the second luminous current source 6 to the first luminous current source 13 side can be suppressed, and further the drive speed of laser diode 2 can be increased. The first luminous current source 13 requires a high power but low grade response driver device can be used and the second luminous current source 6 requires a high response but low power driving device, so that total cost for the driving circuit can be reduced.

(4) Another Embodiment

Incidentally, in the aforementioned embodiment, the case where the average light amount at the time of reproducing is set as the reference value is described, however the present invention is not limited to such a case. The present invention is widely applicable to such a case where the average light amount at the time of recording is set as the reference value, and the like.

Furthermore, in the aforementioned embodiment, the case where the laser diode made from the gallium nitride is driven is described, however the present invention is not limited to such a case. The present invention is widely applicable to the cases where various types of laser diodes are driven.

Furthermore, in the aforementioned embodiment, the case where the light amount of the laser beam is intermittently raised by repeating the prescribed signal waveform as shown in FIGS. 2(A1)–2(D) is described, however the present invention is not limited to such a case. The present invention is widely applicable to the cases where the laser beam is driven, in a word, in a way that the light amount is raised intermittently.

Furthermore, in the aforementioned embodiment, the case where the error signal is processed by integration processing by the compensating circuit 12 is described, however the present invention is not limited to such a case. The integration processing can be omitted provided that practically sufficient precision can be ensured.

Furthermore, in the aforementioned embodiment, the case where the present invention is applied to the optical disk apparatus for accessing the phase change type optical disk is described, however the present invention is not limited to such a case. The present invention is applicable to an optical disk apparatus for accessing a magneto optical disk, and the like.

Furthermore, in the aforementioned embodiment, the case where the present invention is applied to the optical disk apparatus is described, however the present invention is not limited to such a case. The present invention is widely applicable to various laser diode drive signal processors such as a processor for recording desired data on a card-like recording medium and the like by irradiating a laser beam and/or for reproducing and supplying the data recorded on the recording medium, and the like.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. A laser diode drive signal processor for driving a laser diode to be used to emit a laser beam for accessing an optical information recording medium with the laser beam, said processor comprising:

alternating current side driving current supply means for supplying a first driving current according to a signal level of an alternating current component;

light amount detecting means coupled to said laser diode for detecting a light amount of the laser beam;

error signal generating means for generating an error signal based on the detected light amount of the laser beam and a reference signal;

direct current side driving current supply means for supplying a second driving current according to a signal level of the error signal;

adding means for adding the first driving current from said alternating current side driving current supply means and the second driving current from said direct current side driving current supply means to generate a third driving current; and supply means for supplying said third driving current composed of the first and second driving currents to the laser diode.

2. A laser diode drive signal processor according to claim 1, wherein said alternating current side driving current supply means outputs said first driving current through a prescribed coupling capacitor.

3. A laser diode drive signal processor according to claim 2, wherein said light amount detecting means, said error signal generating means and said direct current side driving current supply means form a feedback loop, a loop frequency band of which is set to be equal to or higher than a cut-off frequency based on said coupling capacitor.

4. A laser diode drive signal processor according to claim 1, further comprising compensating means interposed between said direct current side driving current supply means and said error signal generating means for performing integration processing of said error signal.

5. A laser diode drive signal processor according to claim 1, wherein said laser diode is made from gallium nitride.

6. A laser diode drive signal processor according to claim 1, wherein a first output impedance of said alternating current side driving current supply means is set to be equal to or smaller than a forward direction impedance of said laser diode, and a second output impedance of said direct current side driving current supply means is set to be larger than the forward direction impedance of said laser diode.

7. A method for driving a laser diode to be used to emit a laser beam for accessing an optical information recording medium with the laser beam, said method comprising:

supplying a first driving current according to a signal level of an alternating current component;

detecting a light amount of the laser beam;

generating an error signal based on the detected light amount of the laser beam and a reference signal;

supplying a second driving current according to a signal level of the error signal;

adding the first driving current and the second driving current to generate a third driving current; and supplying said third driving current composed of the first and second driving currents to the laser diode.

* * * * *

UNITED STATES PATENT AND TRADEMARK OFFICE
CERTIFICATE OF CORRECTION

PATENT NO. : 6,560,250 B1
DATED : May 6, 2003
INVENTOR(S) : Shigenobu Uchida

It is certified that error appears in the above-identified patent and that said Letters Patent is hereby corrected as shown below:

Column 1,
Line 63, change "id" to -- is --.

Column 7,
Line 51, delete "can" after "device".

Column 8,
Line 42, change "sprit" to -- spirit --.

Signed and Sealed this

Eighteenth Day of November, 2003

JAMES E. ROGAN
*Director of the United States Patent and Trademark Office*